US010635554B2

(12) United States Patent
Chalfant et al.

(10) Patent No.: US 10,635,554 B2
(45) Date of Patent: Apr. 28, 2020

(54) SYSTEM AND METHOD FOR BIOS TO ENSURE UCNA ERRORS ARE AVAILABLE FOR CORRELATION

(71) Applicant: DELL PRODUCTS, LP, Round Rock, TX (US)

(72) Inventors: David K. Chalfant, Round Rock, TX (US); Tuyet-Huong Nguyen, Cedar Park, TX (US); Jose M. Grande, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 273 days.

(21) Appl. No.: 15/654,408

(22) Filed: Jul. 19, 2017

(65) Prior Publication Data

US 2019/0026202 A1     Jan. 24, 2019

(51) Int. Cl.
| | | |
|---|---|---|
| G06F 11/00 | (2006.01) | |
| G06F 11/22 | (2006.01) | |
| G11C 29/00 | (2006.01) | |
| G11C 29/52 | (2006.01) | |
| G06F 11/30 | (2006.01) | |

(52) U.S. Cl.
CPC ........ *G06F 11/2205* (2013.01); *G06F 11/006* (2013.01); *G11C 29/00* (2013.01); *G11C 29/52* (2013.01); *G06F 11/00* (2013.01); *G06F 11/3003* (2013.01)

(58) Field of Classification Search
CPC . G06F 11/2205; G06F 11/3003; G06F 11/006
See application file for complete search history.

(56) References Cited

U.S. PATENT DOCUMENTS

| | | | |
|---|---|---|---|
| 7,120,717 B2 | 10/2006 | Vu | |
| 9,343,181 B2 | 5/2016 | Suhas et al. | |
| 2008/0301529 A1* | 12/2008 | Spanel | G06F 11/1012 714/765 |
| 2013/0007507 A1* | 1/2013 | Raj | G06F 11/0715 714/5.11 |
| 2015/0178243 A1* | 6/2015 | Lowery | G06F 3/0619 709/212 |
| 2016/0277148 A1 | 9/2016 | Heinle et al. | |
| 2016/0328300 A1* | 11/2016 | Rahardjo | G06F 11/1417 |
| 2017/0048304 A1* | 2/2017 | Singh | H04L 67/06 |

* cited by examiner

*Primary Examiner* — Katherine Lin
(74) *Attorney, Agent, or Firm* — Larson Newman, LLP

(57) ABSTRACT

An information handling system includes a first memory, a second memory, and a central processor. The first memory includes a buffer to store uncorrected no action (UCNA) errors for the second memory. The central processor detects a memory data corruption in the second memory, stores a first UCNA error associated with the memory data corruption in the buffer implemented within the first memory, determines whether the buffer is full, and erases an oldest in time UCNA error from the buffer in response to the buffer being full.

20 Claims, 3 Drawing Sheets

SYSTEM AND METHOD FOR BIOS TO ENSURE UCNA ERRORS ARE AVAILABLE FOR CORRELATION

FIELD OF THE DISCLOSURE

The present disclosure generally relates to information handling systems, and more particularly relates to BIOS to ensure UCNA errors are available for correlation.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a first memory, a second memory, and a central processor. The first memory includes a buffer that may store uncorrected no action (UCNA) errors for the second memory. The central processor may detect a memory data corruption in the second memory, may store a first UCNA error associated with the memory data corruption in the buffer implemented within the first memory, may determine whether the buffer is full, and may erase an oldest in time UCNA error from the buffer in response to the buffer being full.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
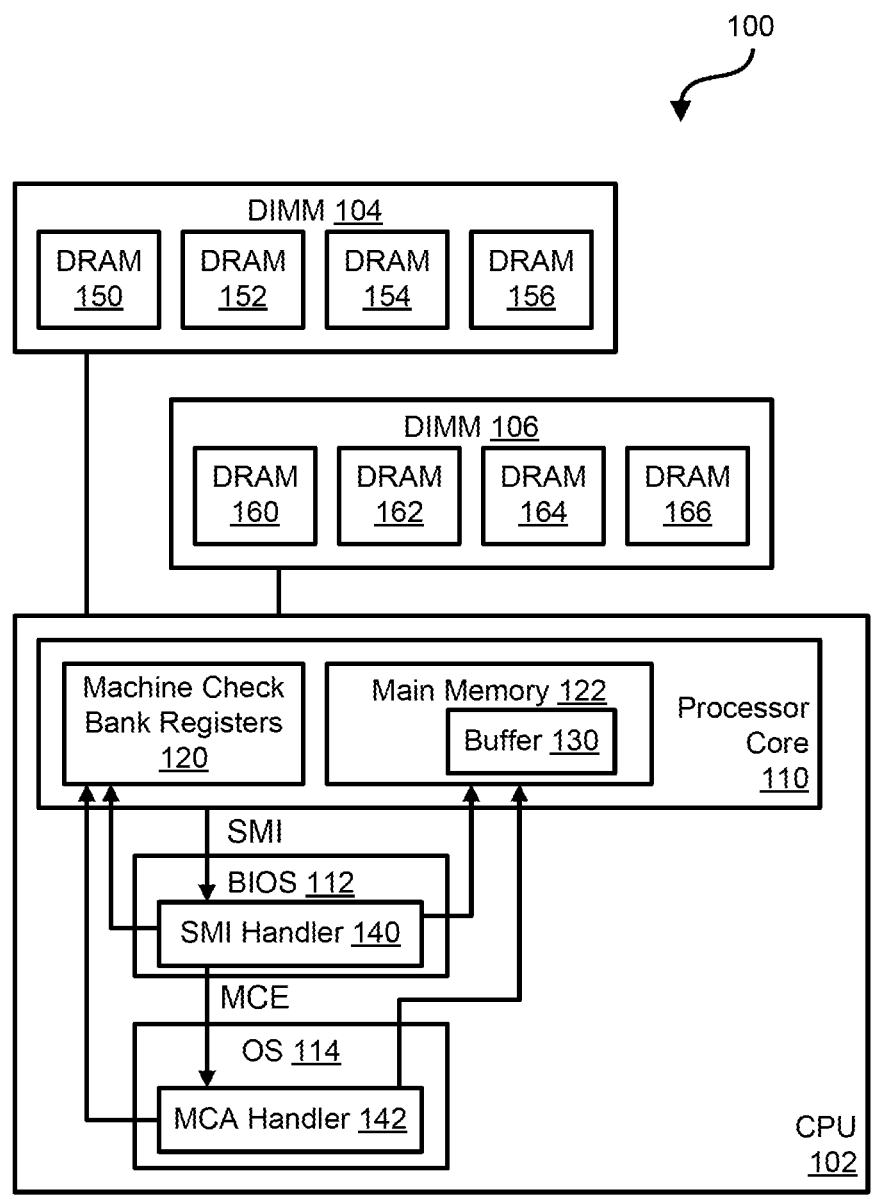
FIG. 1 is block diagram of a system including an information handling system according to at least one embodiment of the disclosure.

FIG. 1 shows a system 100 including an information handling system 102. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more busses operable to transmit communications between the various hardware components.

The information handling system 100 includes CPU 102, and dual in-line memory modules (DIMMs) 104 and 106. In an embodiment, the information handling system 102 can be a server, a personal computer, a laptop computer, or the like. The CPU 102 includes a processor core 110, a basic input/output system (BIOS) 112, and an operating system (OS) 114. The processor core 110 includes machine check bank registers 120 and a main memory 122. In an embodiment, the main memory 122 can be a dynamic random access memory (DRAM) located provided by the memory on DIMMs 104 and 106. In another embodiment, the memory 122 can be a non-volatile random access memory (NVRAM). The main memory includes a buffer 130. The BIOS 112 includes a system management interrupt (SMI) handler 140. In an embodiment, the SMI handler 140 can be a firmware process executed by the CPU 102. The OS 114 includes a machine check architecture (MCA) handler 142. In an embodiment, the MCA handler 142 can be a process in which the CPU 102 reports hardware errors, such as errors in DIMM 104 or 106, to the OS 114. The DIMM 104 includes multiple dynamic random access memories (DRAMs) 150, 152, 154, and 156 (150-156). The DIMM 106 includes multiple DRAMs 160, 162, 164, and 166 (160-166). In an embodiment, DIMMs 104 and 106 can be assigned with processor core 110. In an embodiment, the errors in the DIMMs 104 and 106 can include error correction code (ECC) errors and/or parity errors associated with data stored within the DRAMs 150-156 or 160-166.

During a Unified Extensible Firmware Interface (UEFI) boot process, the processor core 110 can monitor the health of memory subsystems for the information handling system 100, such as the DIMMs 104 and 106, and the detected errors can be classified as either corrected errors or uncorrectable errors. In an embodiment, the processor core 110 can also monitor the health of memory subsystems for the information handling system 100, such as the DIMMs 104 and 106, during runtime after the O/S has booted. The monitor of the health can be done during runtime because the SMI handler 140 can be transparent to the OS and the processor core 110 can provide a means to notify the BIOS of memory errors during both the boot process as well as after the OS has been loaded. The detected error or errors can then be stored in the machine check bank register 120. Also, during the boot process, the processor core 110 can determine whether the buffer 130 is full. In an embodiment, the buffer 130 can be a circular buffer to store uncorrected no action (UCNA) errors that are associated with a memory data corruption in DIMM 104 or 106. In an embodiment, the processor core 110 can determine whether buffer 130 is full during a pre-processing operation of the boot process or during runtime after an UCNA error has been detected. If the buffer 130 is full, the processor core 110 can automatically retire or erase an oldest UCNA error in the buffer 130 so that the buffer can have room to store any new UCNA errors detected during the boot process.

In an embodiment, the CPU 102 can implement corrupt data containment (CDC) or memory data poisoning to increase uptime of the CPU 102 in the event that memory data corruption has been detected. In this situation, the processor core 110 can implement Enhanced Machine Check Architecture Generation 2 (eMCA Gen2), which can enable the processor core 110 to provide system management interrupts (SMI) to the SMI handler 140 of the BIOS 112 for both corrected and uncorrected errors recorded in the machine check bank register 120. During the boot process, the processor core 110 can detect an error in DIMM 104, such as a memory data corruption within one of the DRAMs 150-156 of DIMM 104. In an embodiment, the processor core 110 can also detect an error in DIMM 104, during runtime after the O/S has booted. The detection an error in DIMM 104 can be done during runtime because the SMI handler 140 can be transparent to the OS and the processor core 110 can provide a means to notify the BIOS of memory errors during both the boot process as well as after the OS has been loaded. The processor core 110 can then store an UCNA error associated with the memory data corruption to the buffer 130 after ensuring adequate storage space is available in the buffer 130. In an embodiment, the process of ensuring adequate storage space in the buffer 130 can be done during the pre-processing operation, which deletes the oldest UCNA error in the buffer 130, if necessary, to create room to store the new error record in the buffer 130.

The CPU 102 implementing CDC can enable the processor core 110 not to provide a SMI to the SMI handler 140 to report the source of the error immediately upon detection of the memory data corruption, but the processor 110 can wait until a thread executed in the CPU 102 attempts to consume the memory data corruption. In an embodiment, the memory corruption can lie latent within DIMM 104 or 106 for any period time before a thread attempts to consume the poisoned data associated with the memory corruption. Thus, there is no reason to bring the information handling system 100 down for error containment until a thread actually attempts to consume the data within the corrupted memory.

After the error detection operation of the boot process is completed, the CPU 102 can complete the other phases of the boot process and then enter into an OS phase of operation. During the OS phase of operation, the processor core 110 can execute different threads of the OS 114. During execution of a thread of the OS 130, the CPU 102 can attempt to consume an uncorrected machine check error. In an embodiment, different categories of uncorrected machine check errors can include detected but uncorrectable error (DUE) error, software recoverable action required (SRAR) error, software recoverable action optional (SRAO) error, or the like. In an embodiment, a DUE error can be associated with a thread attempting to consume corrupted data stored in a previously poisoned memory location, and can be an uncorrected fatal error on the information handling system 100 if the information handling system 100 does not support SRAR errors, or SRAO errors. In an embodiment, a SRAR error can be associated with a thread attempting to consume previously poisoned memory with a MCA recovery execution path. The SRAR error can be uncorrected but potentially recoverable if the OS recovery support is present in the CPU 102. In an embodiment, SRAO errors can be associated with uncorrected memory error detection that occurred during a patrol scrub MCA recovery non-execution path. The SRAO error can be uncorrected but potentially recoverable if the OS recovery support is present in the CPU 102.

After the poison data consumption by a thread, the CPU 102 can attempt to correlate the associated error, such as DUE, SRAR, SRAO, or the like, with any previously detected UCNA error in the buffer 130. In an embodiment, the correlation of errors is performed by the CPU 102 comparing the memory address associated with the error to memory address of each previously detected UCNA error now stored in the buffer 130. If the memory address of the error matches a memory address of one of the UCNA errors in buffer 130, the CPU 102 can determine that the error is the result of poisoned data consumption at a memory address previously reported by an earlier UCNA error. The CPU 102 can then identify the source of the error, by the processor core 110 sending a SMI to the SMI handler 140. In an embodiment, the SMI handler 140 can determine that the SMI came from the processor core 110 and can communicate, via host processor commands, with the machine check bank registers 120 to determine the bank that generated the SMI. The SMI handler 140 can also store an enhanced error log, such as DIMM serial number and rank/bank/row/column number of the DIMM 104 or 106 that has the error, in the main memory 122. The SMI handler 140 can then provide a machine check error (MCE) notification to the MCA handler 142 of the OS 114. In an embodiment, the MCE notification can include an Advanced Processor Interrupt Controller Identification (APIC ID) and machine check bank number that caused the SMI, and the source of the error can be identified.

In an embodiment, the processor core 110 can the flag the UCNA when correlated with an actual error consumed by a thread of the OS 114, and the flagging of the UCNA can cause the SMI to be provided to the SMI handler 140. In an embodiment, there can be any number of UCNA errors on a given boot cycle before a thread attempts to consume the actual DUE/SRAR/SRAO error. In previous configurations, the buffer 130 would be of finite size, such that once the buffer is filled with UCNA errors no more errors could be stored. In this situation, either the buffer 130 size would need to be increased to accommodate additional UCNA errors and thereby take more space within the main memory 122 or the newer UCNA errors would not be stored within the buffer 130. Thus, the circular buffer 130, as described above, provides advantages over the prior buffer configurations in that as the older UCNA errors are deleted to make room for the newest UCNA errors. For example, the size of the buffer 130 within the main memory 122 remains the same, but the newest UCNA errors are always available for correlation to DUE/SRAR/SRAO errors detected by a thread of the OS 114. In an embodiment, the processor core 110 can then flag the most recent UCNA errors, which are most likely to match a poison consumption of a thread, remain the buffer 130 without taking too much of the main memory 122 for the buffer 130. If an uncorrected machine check error, DUE/SRAR/SRAO or the like, does not correlate to a previously logged UCNA, then corrective actions can be taken, such as user notification via a base board management controller (BMC), or another service processor that operates in accordance with an Intelligent Platform Management Interface (IPMI), such as an integrated Dell Remote Access Controller (iDRAC) or the like. The corrective action can also include propagation of the MCE to the OS so that the MCA handler 142 can either perform recovery or graceful shutdown, such as blue screen or kernel panic.

Figure 2:
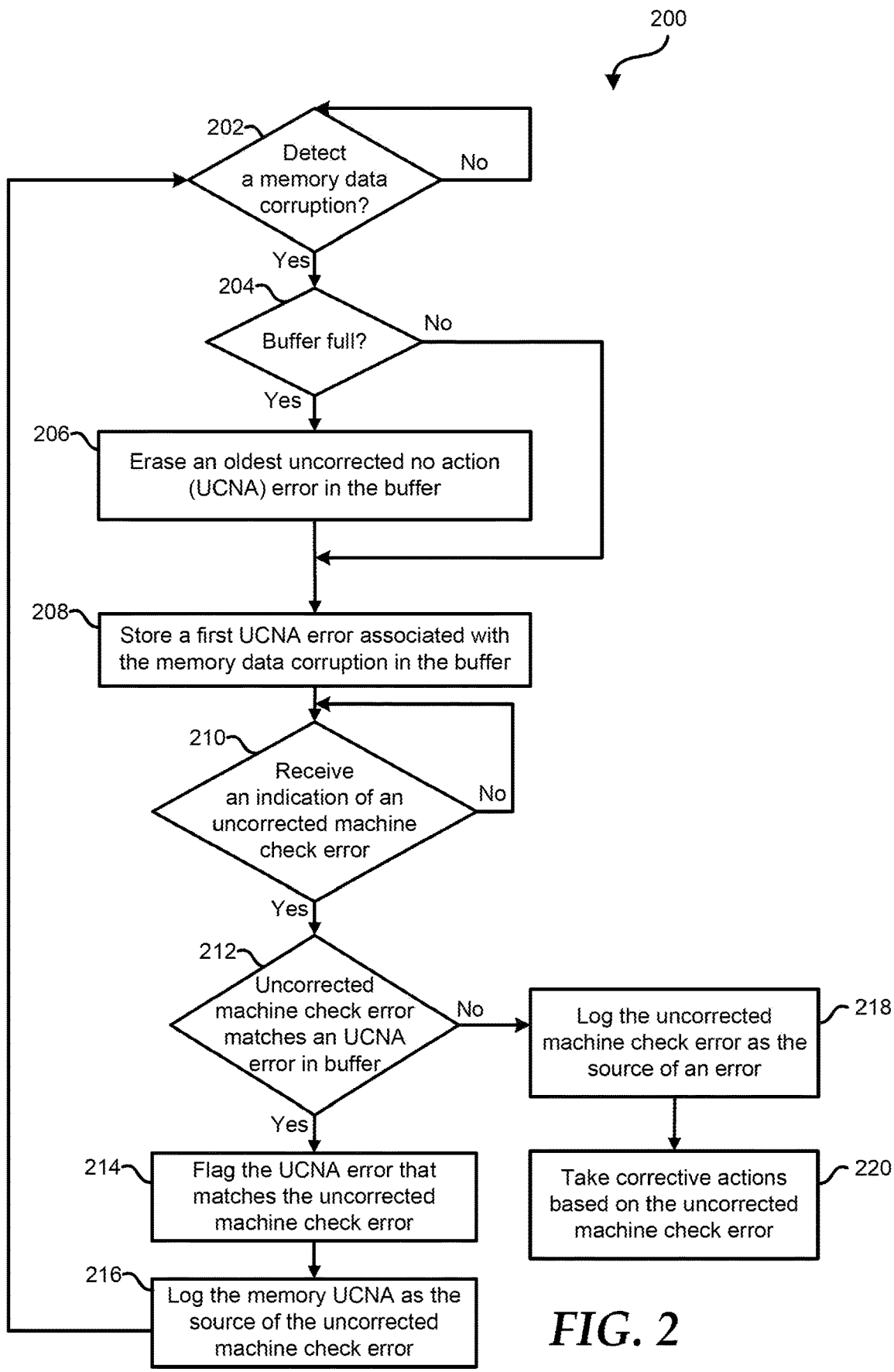
FIG. 2 is a flow diagram of a method for correlating uncorrected no action errors with uncorrected machine check errors according to at least one embodiment of the present disclosure.

FIG. 2 illustrates a method 200 for correlating uncorrected no action errors with uncorrected machine check errors according to at least one embodiment of the present disclosure. At block 202, a determination is made whether a memory data corruption is detected in the second memory. In response to a memory data corrupt being detected, the flow continues at block 204 and a determination is made whether a buffer implemented within a first memory of an information handling system is full. In an embodiment, the determination can be made by a central processor of the information handling system. In an embodiment, the buffer can store uncorrected no action (UCNA) errors for a second memory of the information handling system. In an embodiment, the second memory can be a dual in-line memory module of the information handling system. In an embodiment, the buffer can be a circular buffer of a fixed size, and the first memory can be a dynamic random access memory. If the buffer is not full, the flow continues as block 208. Otherwise, if the buffer is full, an oldest UCNA error is erased from the buffer at block 206. In an embodiment, the erasing of the oldest UCNA error can ensure that the buffer always has room to store a most recent UCNA error when detected.

A first UCNA error associated with the memory data corruption is stored in the buffer at block 208. At block 210, a determination is made whether an indication of an uncorrected machine check error is received at the central processor. In response to the indication being received, a determination is made whether the uncorrected machine check error matches an UCNA error in the buffer at block 212. In an embodiment, the uncorrected machine check error can be a detected but uncorrectable error (DUE) error, software recoverable action required (SRAR) error, software recoverable action optional (SRAO) error, or the like.

If the uncorrected machine check error matches an UCNA error in the buffer, the UCNA error that matches the uncorrected machine check error flagged at block 214. At block 216, the memory UCNA is logged as the source of the uncorrected machine check error, and the flow continues as stated above at block 202. Otherwise, if the uncorrected machine check error does not match an UCNA error in the buffer, the uncorrected machine check error is logged as the source of an error at block 218. At block 220, corrective actions are taken based on the uncorrected machine check error. In an embodiment, the corrective action can be to report the uncorrected machine check error to an end user via a BMC, or another service processor that operates in accordance with an IPMI, such as an iDRAC or the like. Additionally, the corrective action can also include that the uncorrected machine check error is signaled to the OS MCA handler of the information handling system for either error containment or error recovery followed by continued operation. In an embodiment, the error containment can include a bug check, kernel panic, or the like.

Figure 3:
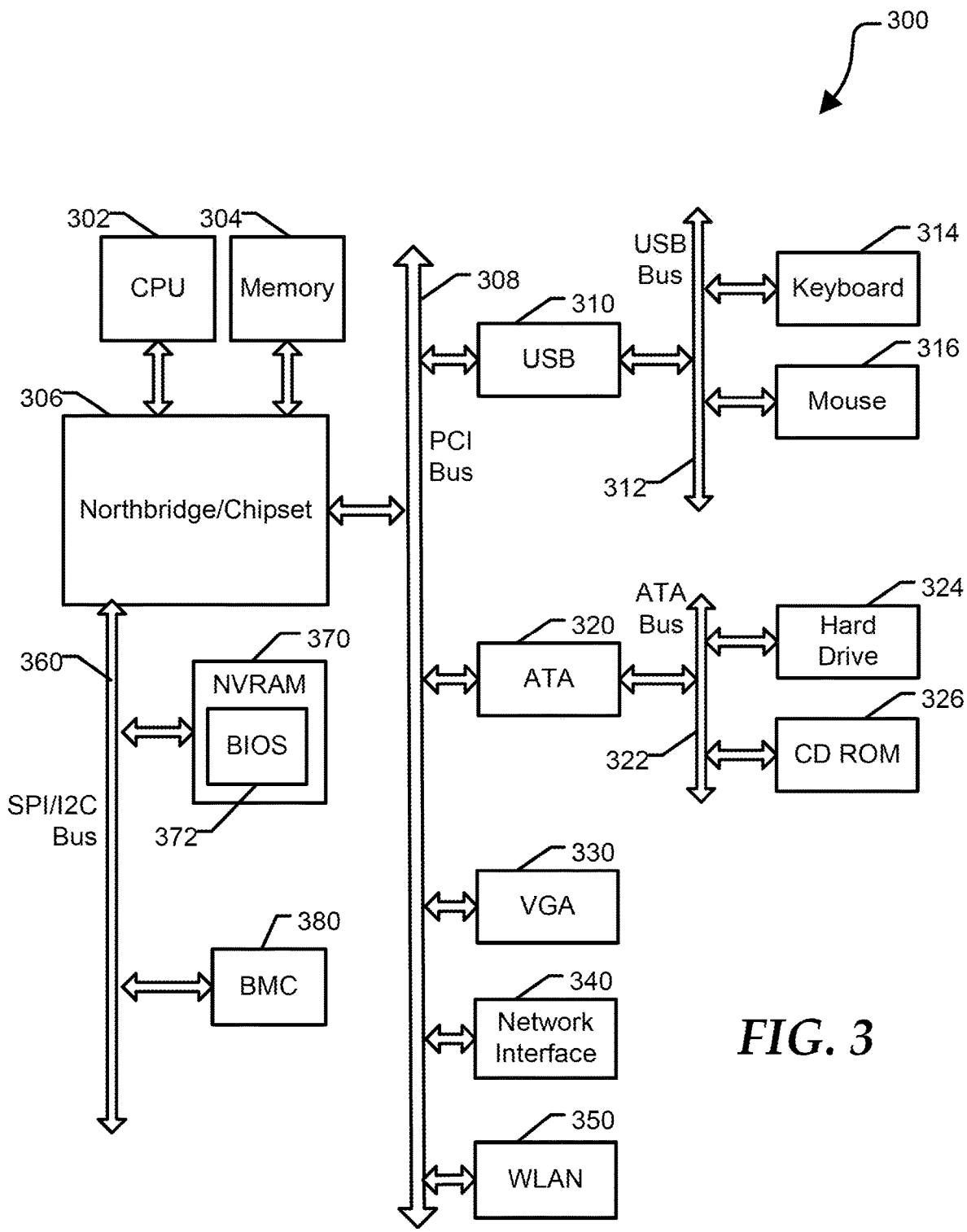
FIG. 3 is a block diagram of a general information handling system according to an embodiment of the present disclosure.

FIG. 3 illustrates a general information handling system 300 including a processor 302, a memory 304, a northbridge/chipset 306, a PCI bus 308, a universal serial bus (USB) controller 310, a USB 312, a keyboard device controller 314, a mouse device controller 316, a configuration an ATA bus controller 320, an ATA bus 322, a hard drive device controller 324, a compact disk read only memory (CD ROM) device controller 326, a video graphics array (VGA) device controller 330, a network interface controller (NIC) 340, a wireless local area network (WLAN) controller 350, a serial peripheral interface (SPI) bus 360, a NVRAM 370 for storing BIOS 372, and a baseboard management controller (BMC) 380. BMC 380 can be referred to as a service processor or embedded controller (EC). Capabilities and functions provided by BMC 380 can vary considerably based on the type of information handling system. For example, the term baseboard management system is often used to describe an embedded processor included at a server, while an embedded controller is more likely to be found in a consumer-level device. As disclosed herein, BMC 380 represents a processing device different from CPU 302, which provides various management functions for information handling system 300. For example, an embedded controller may be responsible for power management, cooling management, and the like. An embedded controller included at a data storage system can be referred to as a storage enclosure processor.

System 300 can include additional processors that are configured to provide localized or specific control functions, such as a battery management controller. Bus 360 can include one or more busses, including a SPI bus, an I2C bus, a system management bus (SMBUS), a power management bus (PMBUS), and the like. BMC 380 can be configured to provide out-of-band access to devices at information handling system 300. As used herein, out-of-band access herein refers to operations performed prior to execution of BIOS 372 by processor 302 to initialize operation of system 300.

BIOS 372 can be referred to as a firmware image, and the term BIOS is herein used interchangeably with the term firmware image, or simply firmware. BIOS 372 includes instructions executable by CPU 302 to initialize and test the hardware components of system 300, and to load a boot loader or an operating system (OS) from a mass storage device. BIOS 372 additionally provides an abstraction layer for the hardware, such as a consistent way for application programs and operating systems to interact with the keyboard, display, and other input/output devices. When power is first applied to information handling system 300, the system begins a sequence of initialization procedures. During the initialization sequence, also referred to as a boot sequence, components of system 300 are configured and enabled for operation, and device drivers can be installed. Device drivers provide an interface through which other components of the system 300 can communicate with a corresponding device.

Information handling system 300 can include additional components and additional busses, not shown for clarity. For example, system 300 can include multiple processor cores, audio devices, and the like. While a particular arrangement of bus technologies and interconnections is illustrated for the purpose of example, one of skill will appreciate that the techniques disclosed herein are applicable to other system architectures. System 300 can include multiple CPUs and redundant bus controllers. One or more components can be integrated together. For example, portions of northbridge/chipset 306 can be integrated within CPU 302. Additional components of information handling system 300 can include one or more storage devices that can store machine-executable code, one or more communications ports for communicating with external devices, and various input and output (I/O) devices, such as a keyboard, a mouse, and a video display. An example of information handling system 300 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Information handling system 300 can include a set of instructions that can be executed to cause the information handling system to perform any one or more of the methods or computer based functions disclosed herein. The information handling system 300 may operate as a standalone device or may be connected to other computer systems or peripheral devices, such as by a network.

In a networked deployment, the information handling system 300 may operate in the capacity of a server or as a client user computer in a server-client user network environment, or as a peer computer system in a peer-to-peer (or distributed) network environment. The information handling system 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 300 can be implemented using electronic devices that provide voice, video or data communication. Further, while a single information handling system 300 is illustrated, the term "system" shall also be taken to include any collection of systems or subsystems that individually or jointly execute a set, or multiple sets, of instructions to perform one or more computer functions.

The information handling system 300 can include a disk drive unit and may include a computer-readable medium, not shown in FIG. 3, in which one or more sets of instructions, such as software, can be embedded. Further, the instructions may embody one or more of the methods or logic as described herein. In a particular embodiment, the instructions may reside completely, or at least partially, within system memory 304 or another memory included at system 300, and/or within the processor 302 during execution by the information handling system 300. The system memory 304 and the processor 302 also may include computer-readable media.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
   a first memory including a buffer to store uncorrected no action (UCNA) errors for a second memory; and
   a central processor to detect a memory data corruption in the second memory, to store a first UCNA error associated with the memory data corruption in the buffer implemented within the first memory, to determine whether the buffer is full during a boot process, and to erase an oldest in time UCNA error from the buffer in response to the buffer being full.

2. The information handling system of claim 1, the central processor to receive an indication of an uncorrected machine check error, to determine whether the uncorrected machine check error matches one of the UCNA errors previously logged in the buffer, and to flag the UCNA error that matches the uncorrected machine check error.

3. The information handling system of claim 2, if the uncorrected machine check error does not match one of the UCNA errors, the central processor to report the uncorrected machine check error to an end user, and to perform a corrective action for the uncorrected machine check error.

4. The information handling system of claim 1, wherein the UCNA errors lie latent within the second memory until a thread attempts to consume data within the detected memory data corruption.

5. The information handling system of claim 1, wherein the second memory is a dual in-line memory module.

6. The information handling system of claim 1, wherein the buffer is a fixed size within the first memory.

7. The information handling system of claim 2, wherein the uncorrected machine check error is selected from a list including: detected but uncorrectable error; software recoverable action required error; and software recoverable action optional error.

8. A method comprising:
   determining, by a central processor of an information handling system, whether a buffer implemented within a first memory is full, wherein uncorrected no action (UCNA) errors for a second memory are stored within the buffer;
   erasing an oldest in time UCNA error from the buffer in response to the buffer being full;
   detecting, by the central processor, a memory data corruption in the second memory; and
   storing a first UCNA error associated with the memory data corruption in the buffer implemented within the first memory;
   wherein the uncorrected machine check error is selected from a list including: detected but uncorrectable error; software recoverable action required error; and software recoverable action optional error.

9. The method of claim 8, further comprising:
   receiving, by the central processor, an indication of an uncorrected machine check error;
   determining whether the uncorrected machine check error matches one of the UCNA errors previously logged in the buffer; and
   flagging the UCNA error that matches the uncorrected machine check error.

10. The method of claim 9, if the uncorrected machine check error does not match one of the UCNA errors, the method further comprising:
    reporting the uncorrected machine check error to an end user; and
    performing a corrective action for the uncorrected machine check error.

11. The method of claim 8, wherein the determination of whether the buffer is full is performed during a boot process of the information handling system.

12. The method of claim 8, wherein the determination of whether the buffer is full is performed during an operating system runtime of the information handling system.

13. The method of claim 8, wherein the buffer is a fixed size within the first memory.

14. The method of claim 8, wherein the uncorrected machine check error is indicated during an operating system phase of operation.

15. A method comprising:
    determining, by a central processor of an information handling system, whether a buffer implemented within a first memory is full, wherein uncorrected no action (UCNA) errors for a second memory are stored within the buffer;
    erasing an oldest in time UCNA error from the buffer in response to the buffer being full;
    detecting, by the central processor, a memory data corruption in the second memory;
    storing a first UCNA error associated with the memory data corruption in the buffer implemented within the first memory, wherein the first UCNA error is used to determine a memory address of an uncorrected machine check error that is consumed by the central processor;
    receiving, by the central processor, an indication of the uncorrected machine check error;
    determining whether the consumed uncorrected machine check error matches the first UCNA error previously logged in the buffer;
    flagging the first UCNA error that matches the consumed uncorrected machine check error; and
    reporting a source of the flagged first UCNA error.

16. The method of claim 15, if the uncorrected machine check error does not match one of the UCNA errors, the method further comprising:
    reporting the consumed uncorrected machine check error to an end user; and
    performing a corrective action for the consumed uncorrected machine check error.

17. The method of claim 15, wherein the determination of whether the buffer is full is performed during a boot process of the information handling system.

18. The method of claim 15, wherein the uncorrected machine check error is selected from a list including: detected but uncorrectable error; software recoverable action required error; and software recoverable action optional error.

19. The method of claim 15, wherein the second memory is a dual in-line memory module.

20. The method of claim 15, wherein the buffer is a fixed size within the first memory.

* * * * *